United States Patent [19]

Bristowe et al.

[11] Patent Number: 4,916,016

[45] Date of Patent: Apr. 10, 1990

[54] METAL OR PLASTIC-CLAD POLYVINYL RESIN LAMINATES

[75] Inventors: William W. Bristowe; Hong C. Kim, both of Wilmington, Del.

[73] Assignee: ICI Americas Inc., Wilmington, Del.

[21] Appl. No.: 15,894

[22] Filed: Feb. 18, 1987

Related U.S. Application Data

[63] Continuation of Ser. No. 821,769, Jan. 23, 1986, abandoned.

[51] Int. Cl.$^4$ .................. B32B 15/08; B32B 27/08; B29C 45/00
[52] U.S. Cl. .................. 428/411.1; 264/259; 264/328.16; 264/331.11; 264/331.16; 264/331.17; 428/412; 428/418; 428/423.1; 428/423.5; 428/423.7; 428/424.6; 428/425.3; 428/457; 428/458; 428/461; 428/463; 428/473.5; 428/474.4; 428/475.2; 428/476.3; 428/480; 428/483; 428/500; 428/515; 428/518
[58] Field of Search ........ 428/480, 482, 370, 457–461, 428/458, 463, 483, 412, 418, 500, 515, 518, 524, 520, 522, 423.1, 425.3, 424.6, 423.5, 423.7, 476.3, 473.5, 475.2, 411.1; 264/259, 328.6, 328.16, 331.16, 331.17, 331.11

[56] References Cited

U.S. PATENT DOCUMENTS

| | | | |
|---|---|---|---|
| 4,036,668 | 7/1977 | Brandon | 264/259 X |
| 4,081,578 | 3/1978 | Van Essen et al. | 427/370 X |
| 4,189,517 | 2/1980 | Shanoski et al. | 428/482 X |
| 4,414,173 | 11/1983 | Cobbledick et al. | 428/482 X |
| 4,822,870 | 4/1989 | Restaino | 428/473.5 X |

FOREIGN PATENT DOCUMENTS 57-83427  5/1982  Japan .................................. 264/259

*Primary Examiner*—Thomas J. Herbert

[57] ABSTRACT

A metal foil or plastic film clad reinforced resin susbstrate which is made by the process of injection molding a polymerizing resin solution under pressure in a closed heated mold cavity having at least one surface covered by a metal foil or plastic film. These laminates are useful as electrical circuit board and EMI/RFI shielding components.

12 Claims, No Drawings

METAL OR PLASTIC-CLAD POLYVINYL RESIN LAMINATES

This is a continuation of application Ser. No. 821,769 filed Jan. 23, 1986, now abandoned.

This invention relates to laminates of reinforced ethylenically unsaturated resins addition polymers bonded directly to metal foils and/or plastic films. It is especially directed to laminates which are made by the reaction-injection-molding process wherein a polymerizing ethylenically unsaturated resin solution is forced into a mold cavity having at least one surface covered by a metal foil or plastic film.

Electrical circuit boards are prepared by laminating metal sheets, for example, copper sheets, with sheets of electrical insulating material such as glass fiber reinforced unsaturated polyester rein sheets. Such electrical circuit boards may be either rigid or flexible and are further classified as single-sided (metal foil on one side of the insulating material only), double-sided (metal foil on both sides of the insulating material) or multi-layered.

Electrical insulating materials is the base or support for the metal sheets bonded thereto. The National Electrical Manufacturers Association (NEMA) has established standards for various base materials. Standards for polyester glass-mat sheet laminates have been established by NEMA such as grades GPO-1, GPO-2 and GPO-3. Some products of this invention meet these standards.

Normally the metal foil, usually copper foil, is secured to the reinforced plastic sheet by means of a suitable adhesive. For example, U.S. Pat. No. 3,700,538 discloses adhesive bonding copper foil to resin-impregnated fiber glass cloth using polyimide resin adhesive. It is also known to add an adhesion promoter to the insulating base material. For example, U.S. Pat. Nos. 3,477,900 and 3,149,021 disclose that when the insulating base material comprises methylmethacrylate resin then unsaturated polyester may be added to the resin as an adhesion promoter to bond a copper foil. However, these patents disclose that an increase in the proportion of polyester is generally accompanied by a decrease in an adhesion of the copper foil to the resinous base. U.S. Pat. Nos. 4,420,509 and 4,093,768 disclose procedures for preparing polyester resin-copper clad laminates. These processes require several steps or expensive continuously operating equipment for their manufacture.

U.S. Pat. No. 4,081,578, 4,189,517, and 4,414,173 are directed to in-mold coating process which are substantially different from the present process in that a preform substrate is either made or placed in a mold and cured. The mold is opened and a small amount of resin is placed on the molded substrate sufficient to form a coating up to about 20 mils. in thickness. The mold is then closed over the polymerizing resin to apply pressure.

Japanese Patent No. 57083-427 discloses a process where an insulation material is mounted on an inner surface of an injection mold and a metal foil is overlaid on the insulated surface and fixed. A thermoplastic resin is melt-injected into the mold to provide a resin product laminated firmly with the metal foil.

The present commercial practice used to produce copper-clad laminates for printed circuit boards involves either molding prepreg materials with a copper foil placed on one or two sides or bonding a copper foil to molded laminates using a separate process step. In either process prepreg materials are prepared before molding takes place. The prepregging operation is a completely independent process step and it requires additional machinery, processing technology, processing time, labor and energy. Essentially the process requires passing a reinforcing glass cloth through a solution of resin, evaporating the solvent, heat treating the resin saturated cloth to a prepreg, and sectioning the prepreg to a predetermined geometry. Molding prepreg materials to form a composite of several ply laminates also requires capital investment and high energy consumption because prepreg materials are normally molded in an autoclave or press at high temperatures, for example, 350° F. for epoxy for an extended period of time. Molding times of one hour are typical. In the case of bonding copper foil after the prepreg molding, the metal cladding operation requires not only an added processing step but introduces additional problems with bonding strength and surface smoothness.

The present invention is directed to a metal foil or a plastic film clad resin laminate having at least one sheet of metal foil or plastic film directly bonded to a shaped resin substrate when made by the process which comprises:

(a) forming an ethylenically unsaturated monomer resin solution of resins selected from the group consisting of ethylenically unsaturated polyesters, vinyl esters, polyester urethanes, methyl methylmethalcrylate, vinyl isocyanurates, and polyurethanes, polyepoxys, nylons, and polymer initiator catalysts to start addition polymerization, (b) immediately injecting said polymerizing solution under pressure into a closed heated mold cavity wherein said mold cavity has at least one surface covered by a metal foil or plastic film, (c) permitting said polymerizing solution to cure in said mold against said metal foil or plastic film under pressure, and removing a cured metal foil or plastic film clad article from said mold.

Of particular interest are compositions containing polyvinylisocyanurate resins. Variations include placing reinforcing fiberous material within the cavity before filling with the polymerizing injectable solution. In either case the fiberous material is impregnated by the polymerizing solution which cures in contact with the metal foil or plastic film. Normally, after a predetermined mold residence time at a predetermined cure temperature the mold is opened to demold the finished clad RIM laminate.

The present invention includes a process for manufacturing metal or plastic film clad polyvinyl isocyanurate-glass fiber laminates which are useful as electrical circuit boards, EMI/RFI shielding components, and other applications. Electrical circuit boards usually employ a copper or other metal foil which is subsequently etched away to leave behind portions of metal foil as electrical conductors. The foil thickness is customarily measured in terms of the number of ounces of metal per square foot of the foil. Electro-deposited copper foil is generally used in the manufacture of electrical circuit boards. Electro-deposited foil is produced by plating on stainless steel drums from which the copper foil is continuously stripped. The inner surface of the resulting foil exhibits a smooth finish whereas the outer surface is coarse thereby promoting improved bonding with the increased surface area. The thickness of the foil is controlled by adjusting the solution concentration and the electrical and mechanical parameters of the plating process. Generally, electrical circuit boards employ copper foil of 1 or 2 ounces per square foot thickness. Foils of 1 ounce per square foot have an approximate thickness of 0.0014 inch (0.0036 cm) whereas 2 ounce foils have an approximate thickness of 0.0028 inch (0.0071 cm). The copper foil used in the following examples had a thickness of 0.001 inch with one surface oxidized to enhance bonding between the copper foil and substrates. Therefore, the copper foil was placed in the cavity with the oxidized surface facing away from the mold surface.

In addition to copper foil may be employed gold, silver, aluminium, magnesium, steel and alloys thereof.

Plastic films made of VICTREX ® polyethersulfone (PES), nylon, polyester, VICTREX ® PEEK (polyether ether ketone), Kapton ® polyimide, polycarbonate, or polyvinylidene floride can be placed in the cavity instead of the copper foil to form either decorative or insulating surface layer or to control surface texture. A VICTREX ® PES film made of the 300 P grade with 0.002 inch thickness was demonstrated to form a good bond with the polyvinyl isocyanurate - glass fiber laminates.

Also included are plastic films coated with metal such as aluminized or copperized polyester films. Such films may be used such that the metal foil or the plastic film is exposed and bonded directly to the polymerizing base resin.

Glass fibers are used to reinforce the polyvinylisocyanurate resins in the process of the present invention. Glass is particularly useful as a reinforcing agent because of its high tensile strength, high modulus of elasticity, ability to be formed to small diameter fibers, inertness and low specific gravity compared to equally strong fibers. In the process of the invention, it is preferred to use glass mat of randomly oriented continuous glass strand having an areal weight of about 3 ounces per square foot. In general, in the process of the present invention, the weight of the glass fiber mat used ranges up to about 40% by weight of the laminates.

Resins which are reaction injectionable may be selected from ethylenically unsaturated polyesters, vinylesters, polyesterurethanes, methylmethacrylate, vinylisocyanurates, and polyurethanes, polyepoxies, nylons, and blends thereof.

The ethylenically unsaturated reaction injection molding material preferably may contain at least 50% by weight of a polyisocyanurate such as poly(1,3,5-tri-R-substituted-S-triazine-2,4,6 trione) wherein the R group contains ethylenic unsaturation or groups reactive with ethylenically unsaturated materials. R groups may also be linked with epoxy, polyurethane and polyester resins. Such isocyanurates are represented by U.S. Pat. Nos. 2,952,665; 3,041,313; 3,821,098; 3,850,770; 3,719,638; 3,437,500; 3,947,736; 3,762,269 and preferably materials described in U.S. Pat. No. 4,128,537 and 4,195,146.

The preferred materials are made by reacting polyisocyanate with a monohydric alcohol containing a vinylidene group in the presence of a catalyst to form an isocyanate containing urethane and thereafter catalytically-trimerizing the isocyanate containing urethane to form an ethylenically unsaturated isocyanurate. The ethylenically unsaturated isocyanurate may be homopolymerized or copolymerized with ethylenically unsaturated monomers to form high molecular weight polymers having excellent physical properties.

The polyisocyanurate resins used in the process are usually monomer solutions of isocyanurate based on toluene diisocyanate and hydroxypropyl methacrylate which are soluble in at least one of the following free radical polymerizable ethylenically unsaturated monomers such as: divinylbenzene, styrene, methylacrylate, methylmethacrylate, ethylacrylate, ethylmethacrylate, 2-ethylhexylacrylate, 2-ethylhexylmethacrylate, butylacrylate, butylmethacrylate, tetramethyleneglycol diacrylate, trimethylolpropane triacrylate, pentaerythritol triacrylate, neopentylglycol diacrylate, 1,3-butyleneglycol diacrylate, 2,3-dibromopropylacrylate, 2,3-dibromopropylmethacrylate, cyclohexylacrylate, cyclohexylmethacrylate, acrylic acid, methacrylic acid, hydroxyethylacrylate, hydroxyethylmethacrylate, hydroxypropylacrylate, hydroxypropylmethacrylate, chlorostyrene, acrylonitrile, vinylidene chloride, vinylacetate, vinylstearate, vinyltoluene, hexanediol diacrylate, hexanediol dimethacrylate and mixtures thereof. The term soluble means that at least 2 grams of the isocyanurate compositions can be dissolved in 100 grams of at least one of the above-listed ethylenically unsaturated monomers of 25° C.

The ethylenically unsaturated isocyanurate resin is prepared by reacting an aromatic polyisocyanate with one of the above-described vinylidene carbonyloxyalkanols to form an isocyanate containing urethane and then trimerizing the isocyanate-containing urethane until essentially all isocyanate groups have reacted to form the ethylenically unsaturated monomer. It is believed that the preferred unsaturated isocyanurate monomer compositions are a mixture of isocyanurates characterized by the following: $R''(R')_{x+1}$ wherein $R''$ is an aromatic radical free of a group which is reacted with an isocyanate group and is obtained by removing the isocyanate groups from an aromatic polyisocyanate wherein x is an integer which is one less than the number of isocyanate groups present in the polyisocyanate wherein each $R'$ is independently

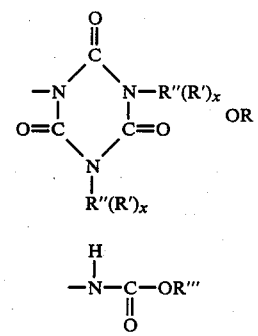

with the proviso that at least one $R'$ is Formula I and each terminal $R'$ is Formula II wherein $R'''$ is a monovalent organic radical having the formula obtained by removing a hydroxyl group from a vinylidene carbonyloxyalkanol characterized by formula (1) through (5) recited below and where each $R''''$ is independently -H or

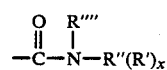

-continued

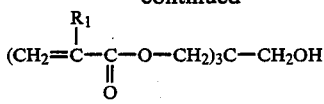 (1)

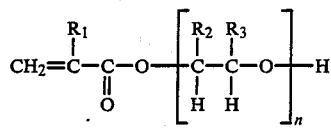 (2)

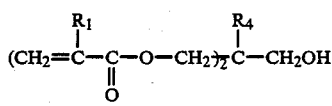 (3)

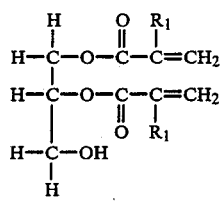 (4)

and

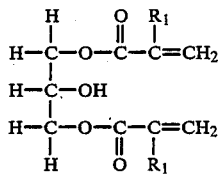 (5)

and wherein the total number of isocyanurate rings in each polymer molecule is less than about 400.

The unsaturated isocyanurate resins may be homopolymerized and preferably copolymerized with one or more other ethylenically unsaturated copolymerizable monomer. Usually the unsaturated isocyanuric composition is copolymerized with a copolymerizable monomer in which the isocyanurate resin is dissolved as described above.

The amount of solvent monomer employed may vary over a very wide range, however, it is preferred that about a 50% solution of isocyanurate resin in ethylenically unsaturated monomer solution be employed. However, a monomer solvent used will range from 30 to 80% by weight of the total composition.

The unsaturated isocyanurate resin solutions may be polymerized or cured in accordance with polymerization conditions conventional in the art for the polymerization of ethylenically unsaturated materials. Isocyanurates employed in this invention particularly styrene solutions of isocyanurates made with toluene diisocyanates or polymethylenepolyphenyl polyisocyanate and hydroxypropylmethacrylate, hydroxyethylmethacrylate or hydroxypropylacrylate are less sensitive to oxygen than conventional vinyl systems in yielding tack free surfaces. In general, the polymerization may be carried out by reacting the unsaturated isocyanurate in the presence of a polymerization initiator. Suitable polymerization initiators include the various peroxide initiators such as benzoyl peroxide, methylethylketone peroxide, di(2-ethylhexyl)peroxydicarbonate, t-butylperbenzoate, dicumyl peroxide and t-butylhydroperoxide. Other polymerization catalysts which may be used also include azo-type initiators such as azobisisobutyronitrile. The amount of the initiator employed is usually very small, for example, from 1 part of initiator per 1,000 parts of polymerizable mixture to about 5 per 100 parts of said mixture.

It is desirable to start polymerization with the application of external heat. In such cases it is customary to add an accelerator to the system. Suitable accelerators include cobalt, manganese, lead, and iron compounds such as cobalt naphthenate and manganese naphthenate and tertiary amines such as dimethylaniline.

Additional RIM processable polymers can be used as a matrix material in copper-clad RIM laminates. For example, unsaturated polyesters, flame retardant unsaturated polyesters and polyurethanes are a more economic choice of matrix material for EMI/RFI (electromagnetic interference/radio frequency interference) shielding applications. Vinyl isocyanurate, however, offers high temperature properties, corrosion resistance and dimensional stability. The solids content of the vinyl isocyanurate in styrene can be varied according to the specific viscosity or property requirement. Vinyl maleate urethanes (VMU), flame retardant and corrosion resistant polyester resins (Atlac ® resins) by ICI Americas Inc. can also be used for the matrix material of the invention. In addition, the Derakane ® vinylesters by Dow Chemicals can be used. RIM processable epoxies, polymethylmethacrylate and the nylons are other candidates for matrix material. Polymer alloys or blends are other classes of materials for the matrix material. For example, alloys of unsaturated polyester/vinylesters and polyurethanes of various compositions can give a range of properties as disclosed in Hutchinson U.S. Pat. No. 3,700,752 on "Interpenetrating Thickening Process Technology". Other polymer blends forming IPN (interpenetrating polymer network) such as epoxy/polyurethane blends can also serve as matrix materials for copper-clad reaction injection molded laminates.

The reinforcing fibers in metal-clad RIM laminates of the invention can be either based on glass, aramid fibers, graphite fibers, steel fibers, inorganic fibers such as boron and alumina or a blend of these. The fiber content can be widely varied. Fiber orientation can be varied to meet a specific functional requirement. Construction can be varied from random mat to woven or even knit structures. For the production of components with a complex shape, the reinforcing fibers can be preshaped by a "preform" process.

According to generally accepted reaction injection molding practice, two reacting component blends one labelled "A" and the other labelled "B" are forced into an impingement mixer and immediately thereafter injected into a closed mold containing reinforcing fiber and a thin sheet of a metal foil or plastic film which lies on one or more surfaces of the mold.

Typically an "A" component is a ethylenically unsaturated monomer solution containing vinyl isocyanurate resin, free radical catalyst and a modifier while the "B" blend contains a similar amount of vinyl isocyanurate resin dissolved in ethylenically unsaturated monomer, an accelerator catalyst and modifier such as antifoam agents, coloring matter, pigment, anti-oxidants and the like. Usually the blend of the "A" component and "B" component are designed to have nearly the same viscosity, however, it is not critical to the practice of this invention that the viscosities be identically matched. It is sufficient to have the "A" and the "B" component free flowing at the mixing head.

It should be pointed out that neither the "A" nor "B" components should contain agents which are normally used to promote nonadhesion to mold surfaces and especially metal mold surfaces when a metal foil is to be employed as cladding material. Such materials are normally referred to as internal mold release agents which either migrate to the surface to prevent sticking or which react with the addition polymer in some manner to provide a slippery resin.

Under most circumstances the "A" and "B" components are preheated to temperatures ranging from 26–50° C. However, for most applications it is preferred to have the mold preheated to establish a fast reaction and reduce the mold residence time.

The following examples will serve to illustrate but not limit the practice of the invention wherein all portions discussed are expressed as parts by weight unless otherwise specified.

Preparation I

Into a chemical reactor equipped with agitator, condenser, gas pipe connections, vents and portholes which is first flushed with nitrogen and thereafter sparged with 2 cfm. air and 6 cfm. nitrogen is added 680 parts of hydroxypropylmethacrylate and agitated at 30 revolutions per minute. Thereafter, 2.5 parts copper acetate catalyst, 12 parts of 20% solution of t-butyl catechol and 5743 parts styrene is charged to the reactor. The contents of the reactor are adjusted to 42° ±2° C. and thereafter sparged with 3-4 cfm. nitrogen. Under increased agitation 50–60 revolution per minute 3063 parts of toluene diisocyanate is added at a rate of 60–70 parts per minute in four 766 part portions. After the first 766 part portion is added the temperature is permitted to rise to 65° C. After the second portion the temperature is permitted to rise to 78° C., after the third portion the temperatures is permitted to rise to 90° C. and after the fourth portions the temperature is permitted to go to no higher than 93° C. Reaction mix is stirred for 1 hour at 90° C. at which time the unreacted isocyanate contents should be less than 4.5%. Reaction mix is cooled to 55° C. and then mixed with 18 parts N-benzyltrimethylammoniumhydroxide as a 40% methanol solution.

The exothermic trimerization reaction takes place with additional cooling. The reaction mixture should not be permitted to go above 60° C. The reaction is continued until the unreacted isocyanate content ranges between 0.05–0.15% and the viscosity ranges between 425–475 cps. At this point 6 parts of methane sulfonic acid is added to inhibit the activity of the trimerization catalyst. The styrene/polyisocyanurate resin solution is stored for later use under conditions which inhibit further polymerization. The product has a number average molecular weight of about 1160, a weight average molecular weight of 2000, and a polydispersity of about 1.9. About 95% of the isocyanurates present have a molecular weight of below about 5200 and contain some isocyanurates having a molecular weight about 5200 and below about 26,000. This product has a ball and ring melting point and of about 95° C. and a viscosity (50% styrene solution) of about 400–600 cps at 25° C. and a refractive index of about 1.557

Preparation II

In equipment described in Preparation I vinylisocyanurate resin was made according to a similar mixing procedure using 5280 parts polyphenylene polymethylene polyisocyanate having 2.2-NCO groups per molecule, 4000 parts hydroxypropylmethacrylate, 9280 parts styrene, 8.4 parts catalyst, 36 parts 10% t-butyl catechol in styrene solution, 18 parts N-benzyltrimethylammonium hydroxide in 40% methanol solution. The resin solution was stored as a 59.4% VIC resin-in-styrene solution until used.

EXAMPLE 1

The RIM machine used was a displacement piston-type laboratory scale machine manufactured by Accuratio Systems Inc. (Model No. Micro RRIM-2+) having 2 gallon capacity reactant tanks and a maximum injection rate of 40–45 pounds per minute. The mold used was made of P-20 steel with the cavity dimensions measuring 12 inch × 12 inch with a ⅛th inch depth. Mold was designed to be filled from the side ("side gating system") by a RIM processible material injected through a sprue peanut mixer, and a runner. The mold was heated to 90° C. by circulating hot water.

The copper foil used was 0.001 inch thick foil with one surface oxidized to enhance bonding between the copper foil and substrates. The copper foil was placed on the cavity with the oxidized surface facing away from the mold surface. Glass mat made by Owens Corning Fiberglass, M-8610 was randomly oriented continuous glass strand mat having 3 ounce per square foot areal weight. The glass mat was cut into 12 inch squares to fit into the mold cavity. Two plies of the glass mat were placed on top of the copper foil. The weight of the glass mat was 144 grams and predesigned to give 40% glass content by weight in the final laminate. The height of the glass mat was about 0.55 inch. As the core portion of the mold closed, it compressed the glass mat to 0.125 inches. This compressive force held the glass mat in place and also resulted in a tight seal between copper foil and the cavity of the mold.

The resin matrix system used was a styrene solution containing 65% solids Vinyl Isocyanurate resin made according to preparation I. The complete formulation and some of the characteristic of the resin components are shown in Table 1.

TABLE 1

Composition and Properties of the Matrix System in Example 1 Formulation

| | Parts by wt. |
|---|---|
| "A" Component | |
| 63% solids Vinyl Isocyanurate | 50.0 |
| 50% Benzoyl Peroxide with Tricresyl Phosphate (Luperco ATC ® by Lucidol) | 3.0 |
| t-Butyl Perbenzoate | 1.0 |
| 10% 4-t-Butylcatechol in styrene | 1.0 |
| "B" Component | |
| 63% solids Vinyl Isocyanurate | 50.0 |
| 6% Cobalt Naphthenate in mineral spirit | 0.2 |
| N,N'-Dimethylparatoluidine | 0.8 |
| Sag 47 (Anti-foam agent) | 1 drop |
| Properties | |
| Viscosity; Comp. A 540 cps at 60 rpm | |
| Comp. B 940 cps at 60 rpm | |
| Stability at R.T.; Both components are stable for longer than 7 days | |
| Density; Comp. A 1.08 gm/cc | |
| Comp. B 1.08 gm/cc | |
| A to B weight ratio; 1.08 | |
| Cure temp.; 90° C. | |
| Cure time; 5 min. | |

The "A" component and "B" component were individually recirculated through the RIM machine at room temperature. The mold was heated to 90° C. with circulating hot water. The reactants were mixed inside the MIX head with 1,500 psi dispensing pressure. The thoroughly mixed reactants were then directed inside the closed mold to impregnate the glass mat and the copper foil. After 5 minutes mold residence time, the mold was opened and the finished part demolded.

The copperclad RIM laminate produced exhibited good glass wet-out, good copper foil to laminate bonding, and flatness. The physical properties of the laminate are summarized in Table 2.

TABLE 2
Properties of the RIM Laminate Produced In Example 1

| | |
|---|---|
| Tensile Modulus | $1.02 \times 10^6$ psi |
| Tensile Strength | 15,100 psi |
| Tensile Elongation | 2.3% |
| Flexural Modulus | $1.20 \times 10^6$ psi |
| Flexural Strength | 32,500 psi |
| Notched Izod | 14.4 ft-lb/in |
| Coefficient of Thermal Expansion | $12.6 \times 10^{-6}$ in/in/°F. |
| Density | 1.37 gm/cc |
| Water Absorption (24 hr) | 0.40% |
| Glass Content | 36.2% by wt. |
| Mold Shrinkage | 2 mils/in |
| Dielectric Constant @ 10 KHz | 3.7 |
| Dissipation Factor @ 10 KHz | 0.0175 |

Materials prepared using the same concept of the invention can be applied to EMI/RFI (electromagnetic interference/radio frequency interference) shielding components. Typical EMI/RFI shielding properties are shown in Table 3.

TABLE 3
EMI/RFI Shielding Properties of Copper Clad RIM Casting (without glass mat)

| | |
|---|---|
| Volume Resistivity | Near 0 ohm. cm |
| Shielding Effectiveness | Higher than 30 dB |

EXAMPLE 2

In apparatus similar to that described for Example 1, a 1/16 inch thick copper clad RIM laminate was made in a cavity having 1/16 inch thickness incorporating 20% by weight glass reinforcement. Details for reactants employed and the physical properties of the resin casting are listed in Table 4.

TABLE 4

| Composition "A" Component | 50 | 59.4% solids VIC of Preparation II |
| --- | --- | --- |
| | | 50% benzoyl peroxide with tricresyl phosphate |
| | 3.5 | Trigonox 29-B75 1,1-Di-t-butyl peroxy-3,3,5-trim ethylcyclohexane |
| | 1.0 | Trigonox KSM (mixed perester solution, Noury) |
| | 0.5 | 59.4% solids VIC of |
| "B" Component | 50 | Preparation II |
| | | 6% cobalt naphthenate in mineral spirit |
| | 0.2 | N,N'-dimethylparatoluidine |
| | 0.8 | Sag 47 (anti-foam agent) |
| | 1 drop | |
| Heat Deflection Temp. @ 264 psi, °C. | 126 | |
| Flexural Strength | | |

TABLE 4-continued

| | |
|---|---|
| R.T., $10^3$ psi Flexural Modulus | 16.9 |
| R.T., $10^6$ psi Notched Izod | 0.50 |
| R.T., ft-lb/in Residual Styrene by DSC, % | 0.26 |
| | None |

Two 1/16 inch laminates were made according to Example 2 using glass mat labelled Run 1 and surfacing veil with one-half glass mat labelled Run 2. These were subjected to a standard solder bath test and held for various times at various temperatures. Results are listed in Table 5.

TABLE 5
Copper Clad RIM Laminates Solder Bath Test

| | | Run 1 | | Run 2 | |
|---|---|---|---|---|---|
| Composition | | 1 | copper foil | 1 | copper foil |
| | | ½ | glass mat (about 20% glass by weight) | 1 | surfacing veil |
| | | | | ½ | glass mat |
| Solder Bath Test | | | | | |
| 20 sec. | @ 240° C. | | pass | | pass |
| 20 sec. | @ 250° C. | | fail | | pass |
| 5 sec. | @ 260° C. | | pass | | pass |
| 20 sec. | @ 260° C. | | fail | | fail |

Superior adhesion of the copper foil is demonstrated by comparing the peel strength of the copper on a laminate of Example 2 with one of the leading isophthalic unsaturated polyester (Koppers 3702-5) laminate when made by same procedure. The vinyl isocyanurate laminate exhibited about 30% higher copper peel strength 3.9 lbs./in. vs. 3.0 lbs./in. for the commercial laminate.

Example 3

Using the same process and resin matrix system as described in Example 1, ⅛ inch thick RIM laminates were made with a 0.002" thick VICTREX ® PES film clad on the laminate surface. The glass content in the laminate was around 20% by weight.

The surface appearance of the PES clad polyvinyl isocyanurate-glass fiber laminates was far superior to that of a PES clad Koppers 3702-5/glass fiber laminate. This was due to the fact that the cure shrinkage of the Vinyl Isocyanurate resin is far less than that of the Koppers 3702-5 isophthalic unsaturated polyester resin with styrene as a crosslinking monomer.

Example 4

Using the process described in Example 1 and a 63% solids Vinyl Isocyanurate resin made according to Preparation II, a ⅛" thick laminate was made with a 0.00060 inch thick Al coated Melinex ® 301 PET film clad on the surface. In addition to the shiny Al metal finish achieved on the laminate surface, this laminate exhibited 0.36 ohm-cm volume resistivity which is acceptable for EMI/RFI shielding applications.

What is claimed is:

1. A metal foil or plastic film-clad laminate having at least one sheet or foil or film directly bonded to a shaped resin when made by the steps comprising:
   (a) forming an ethylenically unsaturated monomer solution of resins selected from the group consisting of ethylenically unsaturated polyesters, vinylesters, polyesterurethanes, methylmethacrylates, methacrylates, vinylisocyanurates, polyurethanes, polyepoxies, and polymer initiator catalysts to start polymerization, free of internal mold release agents which promote nonadhesion to mold surfaces.

(b) immediately injecting said polymerizing solution under pressure into a closed heated mold cavity wherein said mold cavity has at least one surface covered by a metal foil or plastic film, free of agents which promote nonadhesion, (c) permitting said polymerizing solution to cure in said mold against said metal foil or plastic film under pressure, and removing a cured metal foil or plastic film-clad article from said mold.

2. A product of claim 1 wherein said metal foil is selected from the group consisting of copper, silver, gold, aluminum, magnesium, titanium, and steel.

3. A product of claim 1 wherein said plastic film is selected from the group consisting of polyethersulphone, polyetheretherketone, nylon, polyester, polyimide, polycarbonate, and polyvinylidine fluorides.

4. A product of claim 1 when made by the steps which comprises:

(a) mixing a vinyl isocyanurate/ethylenically unsaturated polymer solution with a free radical catalyst to initiate addition polymerization, (b) immediately injecting said polymerizing solution under pressure into a closed heated mold cavity wherein said mold cavity has at least one surface covered by a metal foil or a plastic film, (c) permitting said polymerizing solution to cure in said mold against said metal foil or plastic film under pressure, and removing a cured metal foil or plastic film clad article from said 5. A product of claim 4 wherein said polyvinylisocyanurate resin is made by trimerizing a reaction product of a polyisocyanate selected from the group consisting of toluene diisocyanate, diphenylmethane diisocyanate, and polyphenylene polymethylene polyisocyanate, with stoichiometric quantities of at least one ethylenically unsaturated monomer selected from the group consisting of hydroxypropylmethacrylate, hydroxymethylacrylate, hydroxypropylacrylate, hydroxyethylacrylate, pentaaerythritoltrimethacrylate and mixtures thereof and co-polymers of said vinyl isocyanurate with ethylenically unsaturated solvents.

6. A product of claim 1 wherein said polymerizing solution contains a reinforcing fiberous material.

7. A product of claim 6 wherein said fiber reinforced material is fiberglass and said metal foil is copper.

8. A product of claim 6 wherein said fiberous material is selected from the group consisting of glass, aramid fiber, graphite, metal, boron, aluminum, polyamide, polyimide, and polyester.

9. A product of claim 8 wherein said fiberous material is fiberglass and said metal foil is copper.

10. A product of claim 9 wherein said ethylenically unsaturated solvent is styrene.

11. A product of claim 1 wherein said mold cavity contains a reinforcing fiberous material which is impregnated by said polymerizing solution.

12. A product of claim 11 wherein said fiberous material is selected from the group consisting of glass, aramid, fiber, graphite, metal, boron, aluminum, polyamide, polyimide, and polyester.

* * * * *